(12) United States Patent
Fehler et al.

(10) Patent No.: US 12,431,367 B2
(45) Date of Patent: Sep. 30, 2025

(54) EMBEDDED PACKAGE WITH SHIELDING PAD

(71) Applicant: Infineon Technologies AG, Neubiberg (DE)

(72) Inventors: Robert Fehler, Regensburg (DE); Angela Kessler, Sinzing (DE); Kushal Kshirsagar, Fremont, CA (US); Emanuele Bodano, Villach (AT); Martin Benisek, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 397 days.

(21) Appl. No.: 18/122,895

(22) Filed: Mar. 17, 2023

(65) Prior Publication Data

US 2024/0312799 A1    Sep. 19, 2024

(51) Int. Cl.
| | | |
|---|---|---|
| *H01L 23/31* | (2006.01) | |
| *H01L 21/56* | (2006.01) | |
| *H01L 23/00* | (2006.01) | |
| *H01L 23/373* | (2006.01) | |
| *H01L 23/538* | (2006.01) | |

(52) U.S. Cl.
CPC ........ *H01L 21/565* (2013.01); *H01L 23/3121* (2013.01); *H01L 23/3735* (2013.01); *H01L 23/5383* (2013.01); *H01L 23/5385* (2013.01); *H01L 24/32* (2013.01); *H01L 2224/32245* (2013.01); *H01L 2924/13055* (2013.01);
(Continued)

(58) Field of Classification Search
CPC ............. H01L 23/5383; H01L 23/3735; H01L 23/3121; H01L 21/565; H01L 23/5385; H01L 24/32; H01L 2224/32245; H01L 2924/13055; H01L 2924/13091; H01L 23/552; H01L 24/16; H01L 24/81; H01L 25/16; H01L 2224/16238
See application file for complete search history.

(56) References Cited

U.S. PATENT DOCUMENTS

| | | | |
|---|---|---|---|
| 5,867,367 A | 2/1999 | Barrow | |
| 6,160,223 A | 12/2000 | Gates | |

(Continued)

FOREIGN PATENT DOCUMENTS

| | | |
|---|---|---|
| EP | 1942574 A1 | 7/2008 |
| JP | 2010045111 A | 2/2010 |

OTHER PUBLICATIONS

Deboy, Gerald, et al., "Voltage Regulator Module With Inductor-Cooled Power Stage", U.S. Appl. No. 17/742,442, filed May 12, 2022, 1-35.

*Primary Examiner* — Thanh Y. Tran
(74) *Attorney, Agent, or Firm* — Murphy, Bilak & Homiller, PLLC

(57) ABSTRACT

A semiconductor package includes a laminate package substrate, first and second power transistor dies embedded within the laminate package substrate, a driver die embedded within the laminate package substrate, a plurality of I/O routings electrically connected with I/O terminals of the driver die, a switching signal pad electrically connected with a second load terminal of the first power transistor die and a first load terminal of the second power transistor die, and a shielding pad that is configured to electrically shield at least one of the I/O routings from the switching signal pad during operation of the first and second power transistor dies.

20 Claims, 8 Drawing Sheets

(52) U.S. Cl.
CPC ............... *H01L 2924/13091* (2013.01); *H01L 2924/1815* (2013.01)

(56)     References Cited

U.S. PATENT DOCUMENTS

| | | |
|---|---|---|
| 2003/0141600 A1 | 7/2003 | Van |
| 2007/0075815 A1 | 4/2007 | Lotfi et al. |
| 2008/0272483 A1 | 11/2008 | Oman |
| 2010/0085139 A1 | 4/2010 | Yan et al. |
| 2011/0053319 A1 | 3/2011 | Hohlfeld et al. |
| 2017/0148705 A1 | 5/2017 | Cho |
| 2018/0054119 A1 | 2/2018 | Cho et al. |
| 2018/0182532 A1 | 6/2018 | Stahr et al. |
| 2018/0190573 A1 | 7/2018 | Mullenix et al. |
| 2018/0270957 A1 | 9/2018 | Swaminathan et al. |
| 2019/0324223 A1* | 10/2019 | Yim ................. H04B 10/60 |
| 2020/0161274 A1 | 5/2020 | Lee |
| 2020/0245465 A1 | 7/2020 | Zhang et al. |
| 2021/0105898 A1 | 4/2021 | Chiang et al. |
| 2021/0307173 A1 | 9/2021 | Lenhardt et al. |
| 2022/0093573 A1* | 3/2022 | Kessler ............... H01L 23/5383 |
| 2024/0072739 A1* | 2/2024 | Kim ..................... H01L 25/18 |

\* cited by examiner

EMBEDDED PACKAGE WITH SHIELDING PAD

BACKGROUND

Power stage circuits such as half-bridge and full-bridge circuits are used in many applications such as automotive and industrial applications. These power stage circuits may include power devices that are rated to control large voltages and/or currents, e.g., MOSFETs (metal oxide semiconductor field effect transistors), IGBTs (insulated gate bipolar transistors), diodes, etc., and driver devices that are configured to control the power devices. It is desirable to provide a power stage circuit with high performance, e.g., low power loss, high current density and efficiency, while maintaining a small areal footprint and having robust electrical interconnections. Conventional semiconductor packaging solutions such as lead frame and metal clip-based semiconductor packages have reached physical limits with respect to parameters such as power loss, current density and efficiency. In particular, the soldered connections of these semiconductor packages imposes practical limitations that are not easily overcome.

SUMMARY

A semiconductor package is disclosed. According to an embodiment, the semiconductor package comprises a laminate package substrate comprising a first outer metallization layer at least partially at a first outer side of the laminate package substrate, and a first interior metallization layer that is below the first outer metallization layer, first and second power transistor dies embedded within the laminate package substrate, the first and second power transistor dies each comprising a first load terminal and a second load terminal, a driver die embedded within the laminate package substrate and comprising a plurality of I/O terminals facing the first outer side of the semiconductor package, a plurality of I/O routings formed in the first interior metallization layer and electrically connected with the I/O terminals of the driver die, a switching signal pad formed in the first outer metallization layer and electrically connected with the second load terminal of the first power transistor die and the first load terminal of the second power transistor die, and a shielding pad formed in the first outer metallization layer that is configured to electrically shield at least one of the I/O routings from the switching signal pad during operation of the first and second power transistor dies.

A method of forming a semiconductor package is disclosed. According to an embodiment, the method comprises forming a laminate package substrate comprising a first outer metallization layer and a first interior metallization layer that is below the first outer metallization layer, the first outer metallization layer being disposed at least partially at a first outer side of the laminate package substrate, embedding first and second power transistor dies within the laminate package substrate, the first and second power transistor dies each comprising a first load terminal and a second load terminal, embedding a driver die within the laminate package substrate, the driver die comprising a plurality of I/O terminals facing the first outer side of the semiconductor package, forming a plurality of I/O routings in the first interior metallization layer that are electrically connected with the I/O terminals of the driver die, forming a switching signal pad in the first outer metallization layer that is electrically connected with the second load terminal of the first power transistor die and the first load terminal of the second power transistor die, and forming a shielding pad in the first outer metallization layer that is configured to electrically shield at least one of the I/O routings from the switching signal pad during operation of the first and second power transistor dies.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B, illustrates a plan view of a semiconductor package, according to an embodiment. FIG. 3A illustrates the semiconductor package before formation of an outer layer of electrically insulating material; and FIG. 3B illustrates the semiconductor package after formation of an outer layer of electrically insulating material.

FIGS. 4A and 4B, illustrates a plan view of a semiconductor package, according to an embodiment. FIG. 4A illustrates the semiconductor package before formation of an outer layer of electrically insulating material; and FIG. 4B illustrates the semiconductor package after formation of an outer layer of electrically insulating material.

FIGS. 7A and 7B, illustrates a plan view of a semiconductor package, according to an embodiment. FIG. 7A illustrates the semiconductor package before formation of an outer layer of electrically insulating material; and FIG. 7B illustrates the semiconductor package after formation of an outer layer of electrically insulating material.

FIGS. 8A and 8B, illustrates a plan view of a semiconductor package, according to an embodiment. FIG. 8A illustrates the semiconductor package before formation of an outer layer of electrically insulating material; and FIG. 8B illustrates the semiconductor package after formation of an outer layer of electrically insulating material.

DETAILED DESCRIPTION

Embodiments of a semiconductor package that comprises power transistor dies and a driver die embedded within a laminate package substrate are described herein. The laminate package substrate comprises a plurality of laminate layers that surround and electrically isolate the semiconductor dies. The laminate package substrate additionally comprises a plurality of metallization layers formed on surfaces of the laminate layers that are used to form bond pads and/or route electrical signals. This package construction offers high density integration and routing of a power stage circuit with enhanced electrical and thermal performance. The semiconductor package further comprises a shielding pad formed that is configured to electrically shield one or more I/O routings of the semiconductor package from a switching signal pad. This shielding pad advantageously preserves the signal integrity of the shielded I/O routings and facilitates increased a compact design whereby the I/O routings and the switching signal pad can be close to one another.

Figure 1:
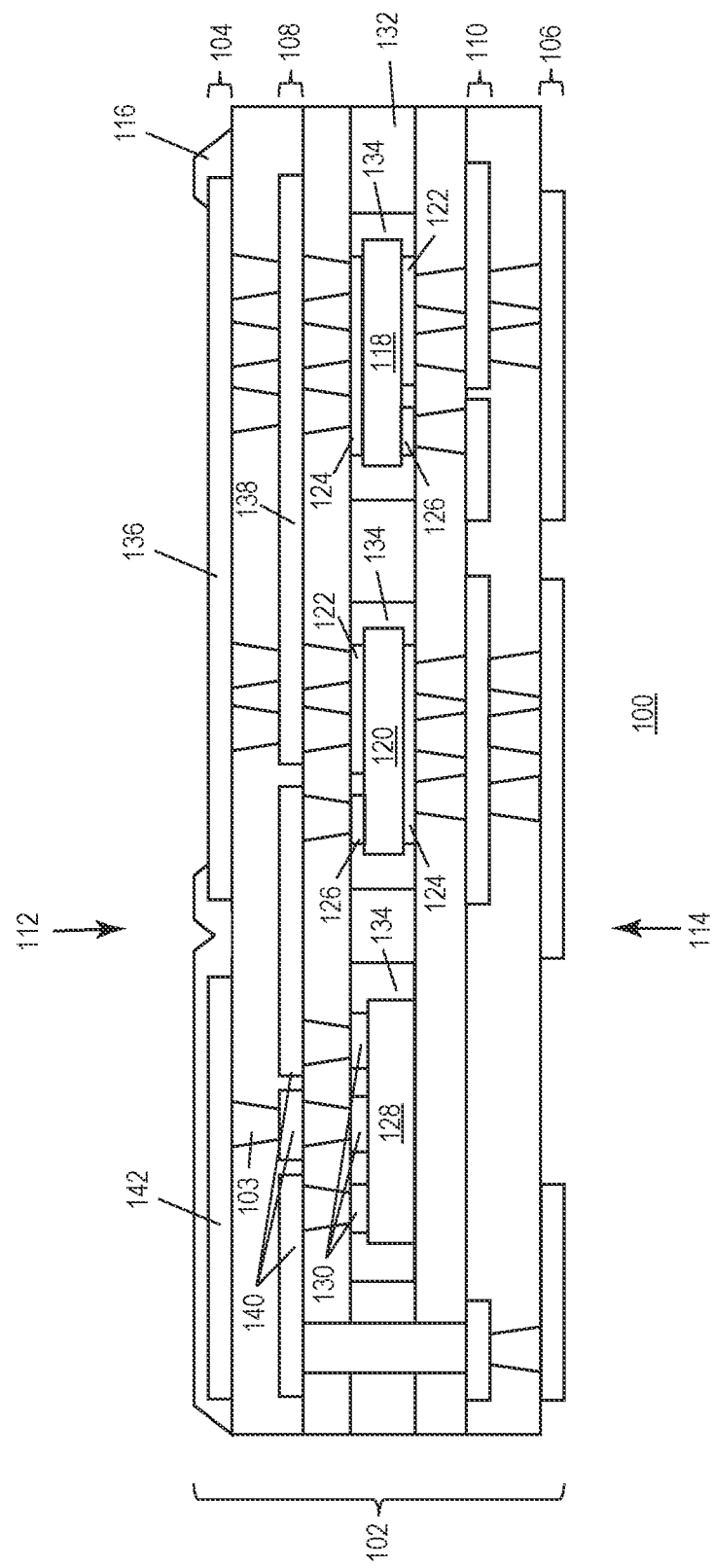
FIG. 1 illustrates a cross-sectional view of a semiconductor package, according to an embodiment.

Referring to FIG. 1, a semiconductor package 100 comprises a laminate package substrate 102. The laminate package substrate 102 comprises a plurality of constituent laminate layers that are stacked on top of one another and used to electrically isolate the elements embedded within the laminate package substrate 102. Each of the constituent laminate layers may comprise an electrically insulating material such as FR-4, FR-5, CEM-4, bismaleimide trazine (BT) resin, etc. Additionally, the laminate package substrate 102 comprises metallization layers formed on the surfaces of the constituent laminate layers. These metallization layers may comprise a conductive metal such as copper (Cu), aluminium (Al), nickel (Ni), silver (Ag), palladium (Pd) gold (Au), etc., and alloys or combinations thereof. The metallization layers can be structured to form internal interconnect lines within the laminate package substrate 102 as well as the bond pads that are exposed at the outer surfaces of the laminate package substrate 102. The laminate package substrate 102 additionally comprises vias 103 that extend through one or more of the constituent laminate layers and provide vertical connection between the vertically separated metallization layers. The vias 103 may comprise electrically conductive metals such as copper, aluminium, tungsten, nickel, etc., and alloys or combinations thereof.

In the depicted embodiment, the laminate package substrate 102 comprises four metallization layers, namely, first and second outer metallization layers 104, 106 and first and second interior metallization layers 108, 110. The first and second outer metallization layers 104, 106 are at least partially disposed at first and second outer sides 112, 114 of the semiconductor package 100, respectively. These first and second outer metallization layers 104, 106 may be at least partially exposed to form an externally accessible bond pad. As shown, the laminate package substrate 102 may comprise an electrically insulating layer 116 disposed at the first outer side 112. The electrically insulating layer 116 may partially or completely cover parts of the first outer metallization layer 104. The electrically insulating layer 116 may comprise lacquer, epoxy, liquid photoimageable solder mask, dry-film photoimageable solder mask, etc. The first and second interior metallization layers 108, 110 are electrically isolated from the exterior environment by the constituent laminate layers of the laminate package substrate 102. The depicted four level construction is just one example of a laminate package construction. More generally, the concepts and features of a semiconductor package 100 described herein are applicable to different types of laminate package constructions, including those with five, six, seven, eight, etc., layers of metallization.

The semiconductor package 100 comprises first and second power transistor dies 118, 120 embedded within the laminate package substrate 102. The first and second power transistor dies 118, 120 may be configured as discrete switching devices, e.g., MOSFETs (Metal Oxide Semiconductor Field Effect Transistors), IGBTs (Insulated Gate Bipolar Transistors), and HEMTs (High Electron Mobility Transistors), etc, that are rated to accommodate voltages of at least 100 V (volts), at least 600 V, at least 600 1200V or more and/or rated to accommodate currents of at least 1 A (amperes), at least 10 A, at least 50 A, at least 100 A or more. The first and second power transistor dies 118, 120 each comprise a first load terminal 122 disposed on a main surface and a second load terminal 124 disposed on a rear surface of the respective die. The first and second load terminals 122, 124 are the voltage blocking terminals of the device, e.g., source and drain terminals in the case of a MOSFET, collector and emitter terminals in the case of an IGBT, etc. In the depicted embodiment, the orientation of the first and second power transistor dies 118, 120 is reversed. As such, the second load terminal 124 of the first power transistor die 118 and the first load terminal 122 of the second power transistor die 120 each face the first outer side 112 of the semiconductor package 100, and the first load terminal 122 of the first power transistor die 118 and the second load terminal 124 of the second power transistor die 120 each face the second outer side 114 of the semiconductor package 100. The first and second power transistor dies 118, 120 each comprise a gate terminal 126 that is configured to control the conductive connection between the first and second load terminals 122, 124 of the respective die. In the depicted embodiment, the gate terminal 126 is disposed on the main surface of each die. As a result, the gate terminal 126 of the first power transistor die 118 faces the first outer side 112 of the semiconductor package 100, and the gate terminal 126 of the second power transistor die faces away from the first outer side 112 of the semiconductor package 100. In other embodiments, the gate terminal 126 may be disposed on a rear surface of each die. Moreover, the first and second power transistor dies 118, 120 may be configured such that the gate terminals 126 each face in the same direction.

According to an embodiment, the first and second power transistor dies 118, 120 form the high-side switch and the low-side switch, respectively, of a half bridge circuit. A half-bridge circuit refers to one type of circuit topology that is used in a power conversion circuit, such as a DC to DC converter, DC to AC converter, etc. In a half bridge circuit, one load terminal of the high-side switch (e.g., the drain/collector) is connected to a first DC voltage (e.g., a positive potential), one load terminal of the low-side switch (e.g., the source/emitter) is connected to a second DC voltage (e.g., negative potential or ground), and the remaining two load terminals (e.g., the source/emitter of the high-side switch and the drain/collector of the low-side switch) are connected together to form the output or switch ('SW') of the half-bridge circuit. The control (gate) terminals of the high-side and low-side switch can be switched according to a power control scheme (e.g., pulse width modulation) to produce a desired voltage and frequency at the output of the half-bridge circuit.

The semiconductor package 100 additionally comprises a driver die 128 embedded within the laminate package substrate 102. The driver die 128 may be used to control the switching of the first and second power transistor dies 118, 120. The driver die 128 may be a logic device, such as a silicon based integrated circuit, for example. The driver die 128 comprises a plurality of I/O (input/output) terminals 130 disposed on a main surface the driver die 128 that faces the first outer side of the semiconductor package 100. These I/O terminals 130 may include an input terminal that receives a power switching signal, such as a PWM (pulse with modulation) signal. The I/O terminals 130 may additionally include output terminals that are configured to provide a gate signal to the first and second power transistor dies 118, 120 based upon the power switching signal. The I/O terminals 130 may additionally include input terminals that receive information used to tune or adjust the gate signals, e.g., sense signals about the operational state of the first and second power transistor dies 118, 120.

The first and second power transistor dies 118, 120 and the driver die 128 are embedded within the laminate package substrate 102 below the first outer metallization layer 104 and the first interior metallization layer 108. The embedding process may comprise providing a core laminate layer 132 of the laminate package substrate 102 that is formed of a pre-preg material such as FR-4, FR-5, CEM-4 and comprises pre-defined openings. Each of the first and second power transistor dies 118, 120 and the driver die 128 may be arranged within one of these pre-defined openings. Subsequently, these pre-defined openings may be filled with a resin material 134 such as bismaleimide trazine (BT) to encapsulate the dies. Subsequently, the metallization layers and the constituent laminate layers may be formed thereon.

The semiconductor package 100 comprises a switching signal pad 136 formed in the first outer metallization layer 104. The switching signal pad 136 is electrically connected with the second load terminal 124 of the first power transistor die 118 and the first load terminal 122 of the second power transistor die 120. Thus, the switching signal pad 136 may form the output or switch ('SW') node of the above-described half-bridge circuit. In the depicted embodiment, the semiconductor package 100 comprises an internal connection pad 138 that is formed in the first interior metallization layer 108 and used to complete the vertical connection between the first and second power transistor dies 118, 120 and the switching signal pad 136. The switching signal pad 136 and the internal connection pad 138 may overlap with the second load terminal 124 of the first power transistor die 118 and the first load terminal 122 of the second power transistor die 120, thereby facilitating a direct vertical connection. The switching signal pad 136 is preferably made large to facilitate a low-resistance electrical connection with the first and second power transistor dies 118, 120. In some applications, the switching signal pad 136 may be used to accommodate the mounting of one or more passive components thereon. These passive components may include discrete inductors and/or heat sink structures. Accordingly, maximizing the area of the switching signal pad 136 may lead to an advantageous reduction in electrical and thermal resistance between the switching signal pad 136 and the passive components mounted thereon.

Figure 2:
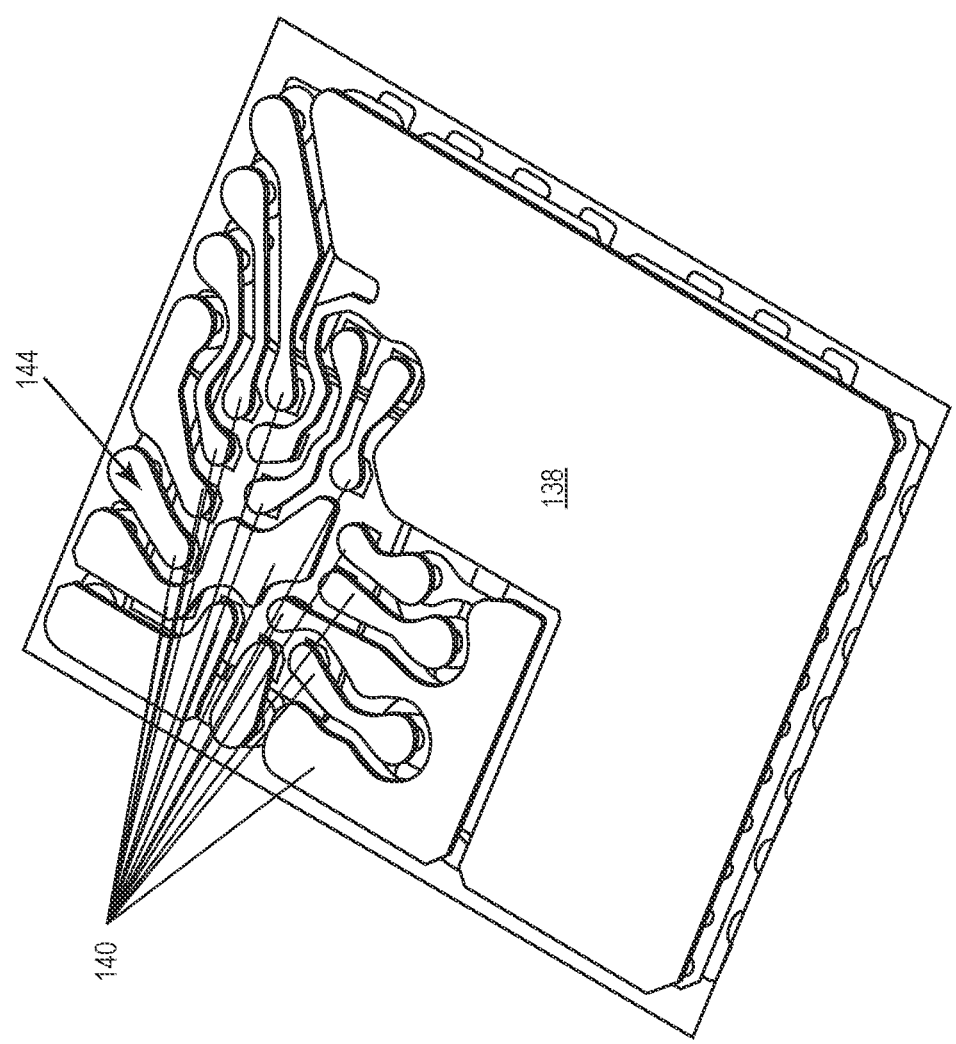
FIG. 2 illustrates an isometric view of an interior metallization layer of a semiconductor package, according to an embodiment.

The semiconductor package 100 comprises a plurality of I/O routings 140 formed in the first interior metallization layer 108. FIG. 1 shows several of the I/O routings 140 and FIG. 2 shows each of the I/O routings 140 from an isometric perspective. The I/O routings 140 are electrically conductive tracks that are used to route the signals transmitted to/from the I/O terminals 130 of the driver die 128. The I/O routings 140 fan-out from the driver die 128 and occupy an area of the first interior metallization layer 108 unoccupied by the internal connection pad 138. Some of the I/O routings 140 are routed to via locations to reach the vias 103, thereby facilitating a connection with the die terminals that face the second outer side 114 of the laminate package substrate 102 and/or with external terminals formed at the second outer side of the laminate package substrate 102. Some of the I/O routings 140 are routed directly between the main surface of the driver die 128 and the main surfaces of the first and second power transistor dies 118, 120. Examples of these I/O routings 140 include gate signal routings between the driver die 128 and the gate terminals 126 of the first and second power transistor dies 118, 120.

The semiconductor package 100 comprises a shielding pad 142 that is configured to electrically shield at least one of the I/O routings 140 from the switching signal pad 136 during operation of the first and second power transistor dies 118, 120. The shielding pad 142 forms a potential plane that is between the switching signal pad 136 and the I/O routings 140 and prevents an electric field from developing between the switching signal pad 136 and the I/O routings 140. As the switching signal pad 136 may conduct electrical signals with very large voltage swings, e.g., on the order of 100V, 600V, 1200V or more, within relatively short durations, e.g., within 50 nanoseconds, within 25 nanoseconds, within 10 nanoseconds, etc., the electrical shielding of the of the I/O routings 140 by the shielding pad 142 advantageously mitigates capacitive coupling and maintains high signal quality (low-noise) in the I/O routings 140 that are shielded.

According to an embodiment, the shielding pad 142 is set to a fixed reference potential. For example, the shielding pad 142 may be connected to an AGND (analog ground) node of the semiconductor package 100. The AGND node is a dedicated node that is set to ground potential and is electrically isolated from the power switching devices. Thus, the AGND node may be electrically isolated from a ground node of the semiconductor package 100 that is connected with one of the load terminals of the first and second power transistor dies 118, 120, e.g., the drain terminal of the low-side switch. As shown in FIG. 1, the shielding pad 142 may be connected with one of the I/O routings 140 by a via 103. This connection may provide the AGND node connection.

According to an embodiment, the shielding pad 142 is formed in the first outer metallization layer 104. In the depicted embodiment, the first outer metallization layer 104 is a closest metallization layer of the laminate package substrate 102 to the first interior metallization layer 108, thus providing a high degree of electrical shielding. As mentioned above, the laminate package substrate 102 may have different numbers of metallization than what is shown. In that case, a shielding pad 142 may be provided within any metallization layer that is immediately above the I/O routings 140 and/or at the same level as the as the switching signal pad 136.

As mentioned above, it may be desirable to make the switching signal pad 136 large to facilitate low thermal and electrical resistance. The switching signal pad 136 may therefore occupy a large proportion of the area used by the first outer metallization layer 104 (e.g., at least 75%, at least 80%, or more), with the shielding pad 142 occupying the remaining part of the area used by the first outer metallization layer 104. According to an embodiment, the shielding pad 142 and the switching signal pad 136 are the only two electrical nodes of the semiconductor package 100 that are formed first outer metallization layer 104. That is, no other bond pads or electrical routings carrying different signals are formed in the first outer metallization layer 104. In his way, the size of the switching signal pad 136 may be maximized.

Figure 3:
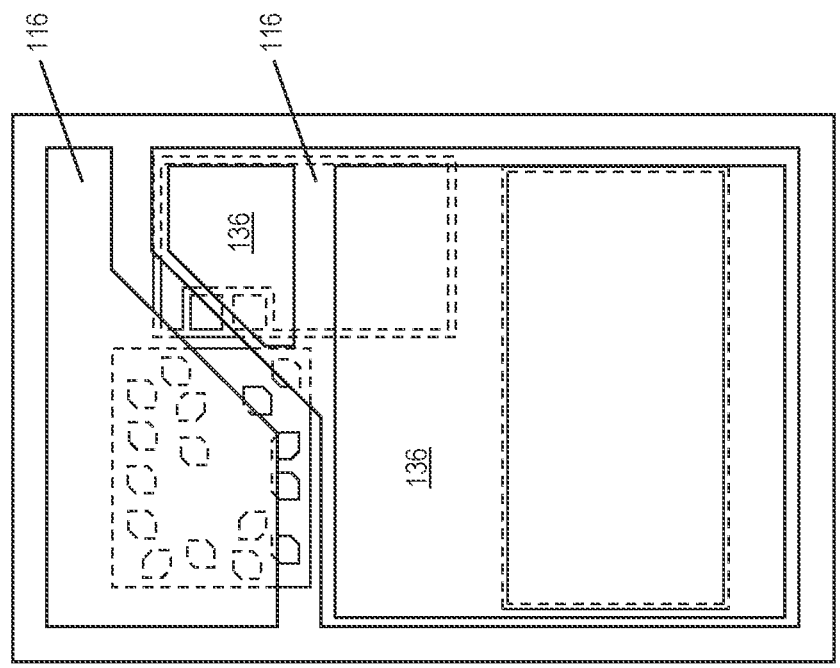
FIG. 3, which includes
Figure 3:
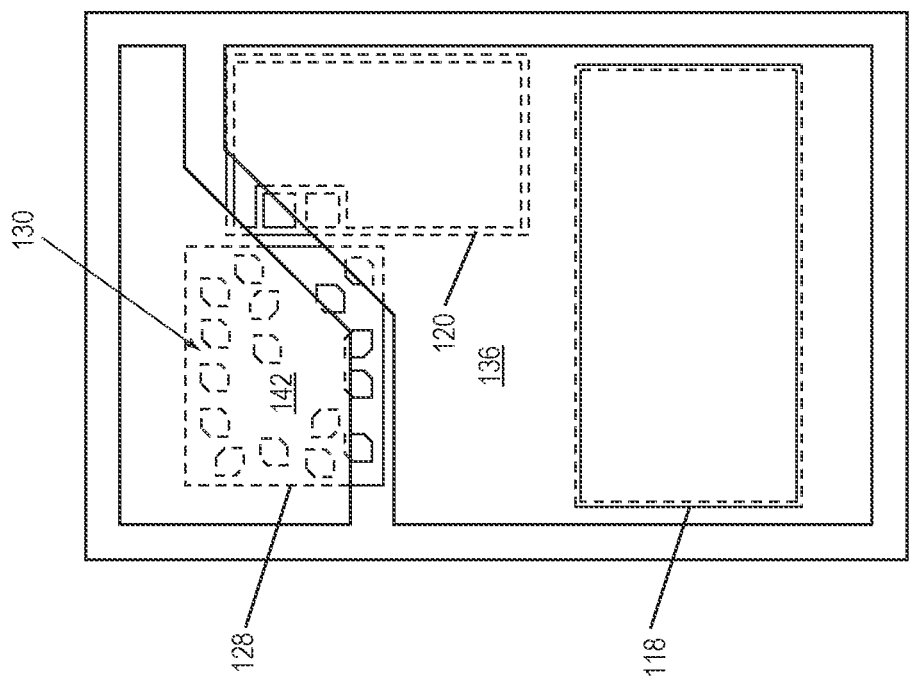

As can be appreciated from the combination of FIGS. 1, 2, and 3 the shielding pad 142 may be formed to overlap with some of the I/O routings 140. This maximizes the shielding effect with respect to these I/O routings 140. For illustration purposes, a first one 144 of the I/O routings is shown in FIG. 2. The first one 144 of the I/O routings 140 may be from a group of the I/O routings 140 that the shielding pad 142 completely overlaps with. These I/O routings 140 may transmit signals that are particularly sensitive to interference from the switching signal pad 136, and thus electrically shielded by the shielding pad 142 to the extent possible. According to an embodiment, the first one 144 of the I/O routings 140 is a sense signal routing that conveys a current magnitude signal, i.e., an electrical current wherein the information is contained via the magnitude of the current, to the driver die 128. The current magnitude signal may represent an operational state of the first and second power transistor dies 118, 120, e.g., a load current flowing through one of first and second power transistor dies 118, 120. The driver die 128 may generate this current magnitude signal and provide it to an external controller, which adjusts a switching signal that that switches one of the first and second power transistor dies 118, 120. The shielding pad 142 is arranged to completely overlap with this first one 144 of the I/O routings 140. As a result, current fluctuation within the first one 144 of the I/O routings 140 that occurs during a switching event of the switching signal pad 136 is substantially reduced.

Referring to FIG. 3, plan view-configurations of the shielding pad 142 and the switching signal pad 136 are shown, according to an embodiment. In this embodiment, the shielding pad 142 comprises a trapezoid shaped area disposed to one side of the device that overlaps with the driver die 128 and associated I/O terminals 130, thereby overlapping with a group of the I/O routings 140 (e.g., the routings shown in FIG. 2). The shielding pad 142 comprises a narrow span that extends out from the trapezoid shaped area that overlaps with some of the I/O routings 140. The geometry of the shielding pad 142 may differ, depending on the location of the I/O routings 140 and in particular those that are sensitive to capacitive coupling with the shielding pad 142. The switching signal pad 136 occupies the remaining area of the first outer metallization layer 104 and overlaps with the first and second power transistor dies 118, 120. As shown, the switching signal pad 136 may partially overlap the driver die 128 at a location that wherein the I/O routings 140 are not particularly sensitive to cross-coupling.

In the embodiment of FIG. 3, the shielding pad 142 is completely covered by electrically insulating layer 116. As a result, the shielding pad 142 is isolated from the exterior environment can be maintained at a fixed potential. Meanwhile, the switching signal pad 136 is mainly exposed from the electrically insulating layer 116, thus allowing for external connection thereto. In the depicted embodiment, the electrically insulating layer 116 comprises two openings in the electrically insulating layer 116 with a larger portion of the switching signal pad 136 being exposed by a lower opening and a smaller portion of the switching signal pad 136 being exposed by a second opening. This arrangement may be used to prevent lateral solder flow from the soldering of a device on the shielding pad 142.

Figure 4:
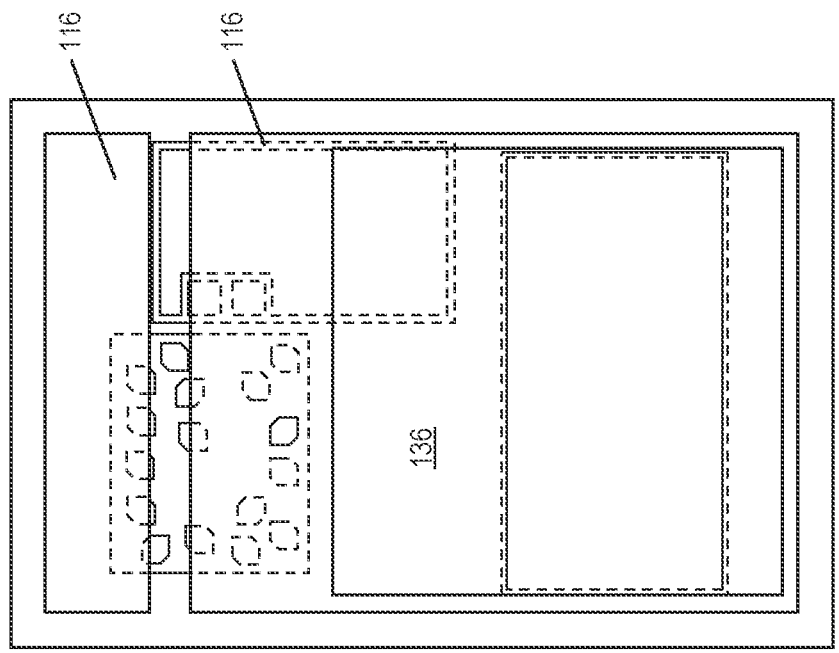
FIG. 4, which includes
Figure 4:
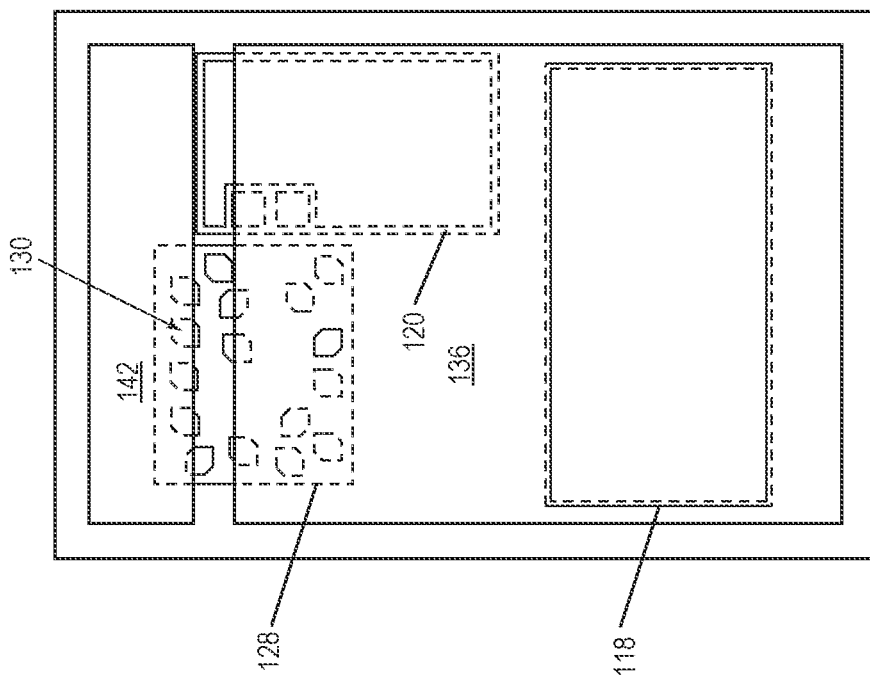

Referring to FIG. 4, plan view-configurations of the shielding pad 142 and the switching signal pad 136 are shown, according to an embodiment. The embodiment of FIG. 4 differs from that of FIG. 3 with respect to the geometry of the shielding pad 142 and the switching signal pad 136. In this case, the shielding pad 142 is configured as a narrow strip that is disposed in a small region of the first outer metallization layer 104. In contrast to the embodiment of FIG. 3, the larger trapezoidal part of the shielding pad 142 is omitted such that there is minimal overlap with the driver die 128. Instead, the shielding pad 142 covers the I/O terminals 130 and associated I/O routings (e.g., the routings shown in FIG. 2) that may require shielding. Meanwhile, the switching signal pad 136 is formed in the remaining part of the first outer metallization layer 104 to the extent possible.

Figure 5:
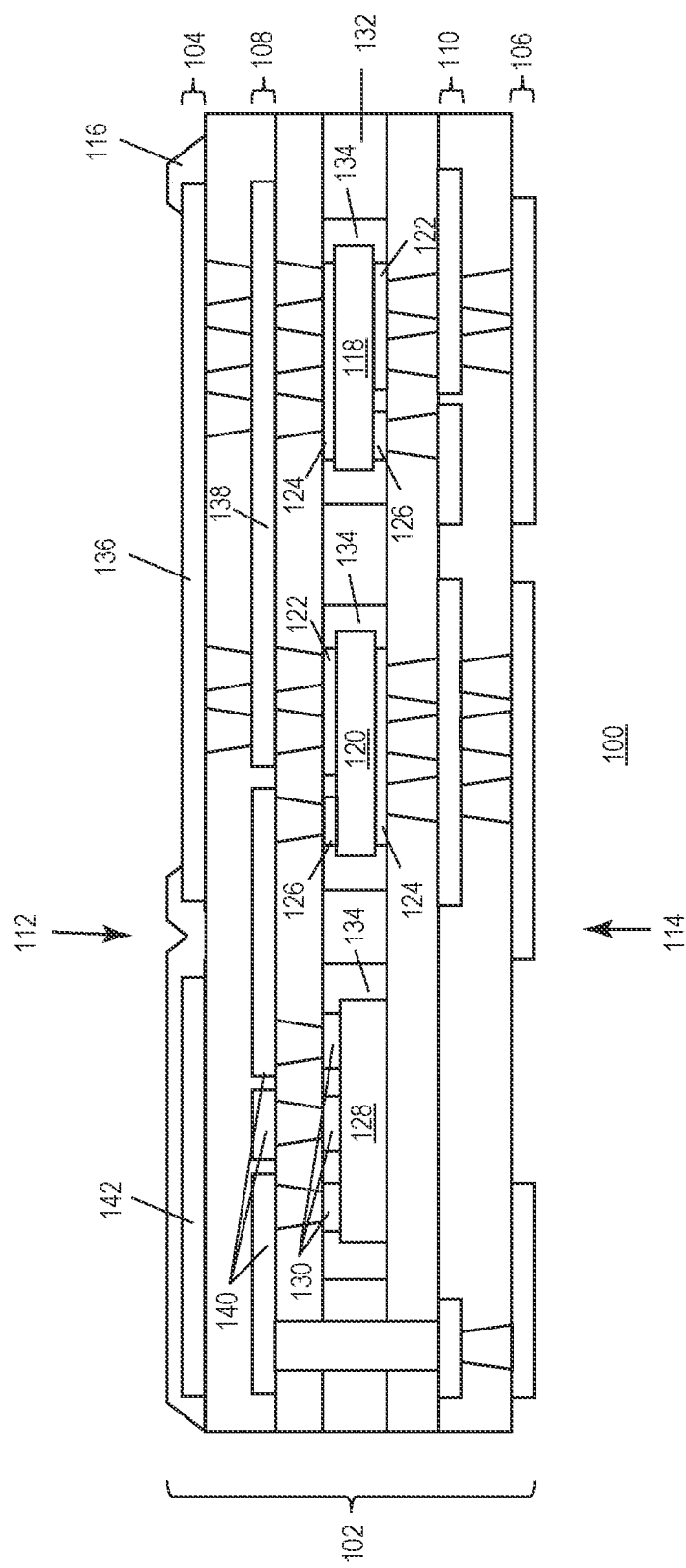
FIG. 5 illustrates a cross-sectional view of a semiconductor package, according to an embodiment.

Referring to FIG. 5, a cross-sectional view of the semiconductor package 100 is shown, according to another embodiment. In this embodiment, the shielding pad 142 is electrically floating. That is, the shielding pad 142 is completely electrically disconnected from any other electrical node of the semiconductor package 100. Thus, as shown, there are no via connections with the shielding pad 142 to a subjacent electrical node from the interior metallization layer. From a plan-view perspective, the first outer metallization layer 104 with an electrically floating shielding pad 142 may have either one of the above-disclosed geometries.

Figure 6:
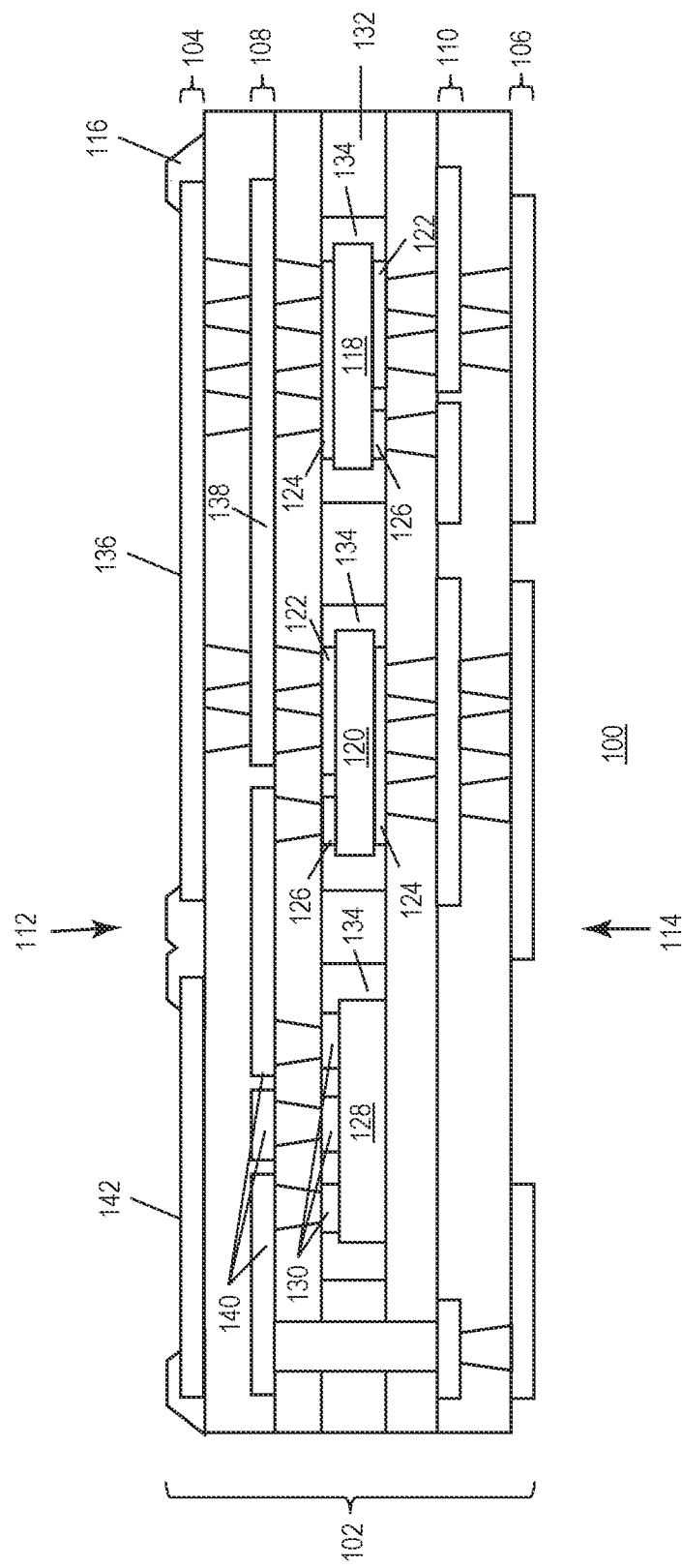
FIG. 6 illustrates a cross-sectional view of a semiconductor package, according to an embodiment.

Referring to FIG. 6, a cross-sectional view of the semiconductor package 100 is shown, according to another embodiment. In the embodiment of FIG. 6, the shielding pad 142 is exposed from the electrically insulating layer 116. As a result, the shielding pad 142 is externally accessible at the first outer side 112 of the semiconductor package 100. This configuration may be used to apply an external potential to the shielding pad 142, such as an external ground signal to the shielding pad 142. Separately or in combination, this configuration may improve the cooling effect of the semiconductor package 100.

Figure 7:
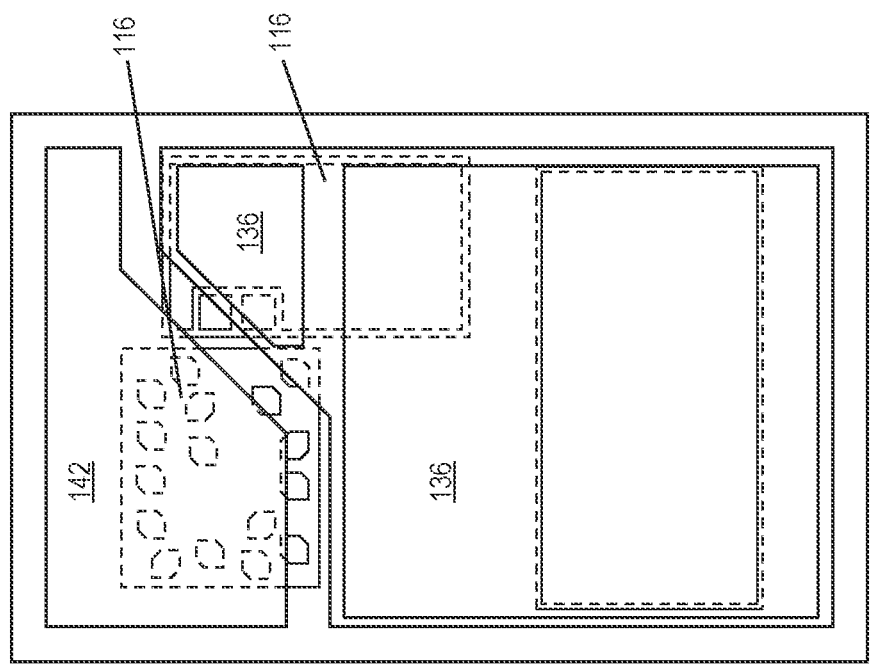
FIG. 7, which includes
Figure 7:
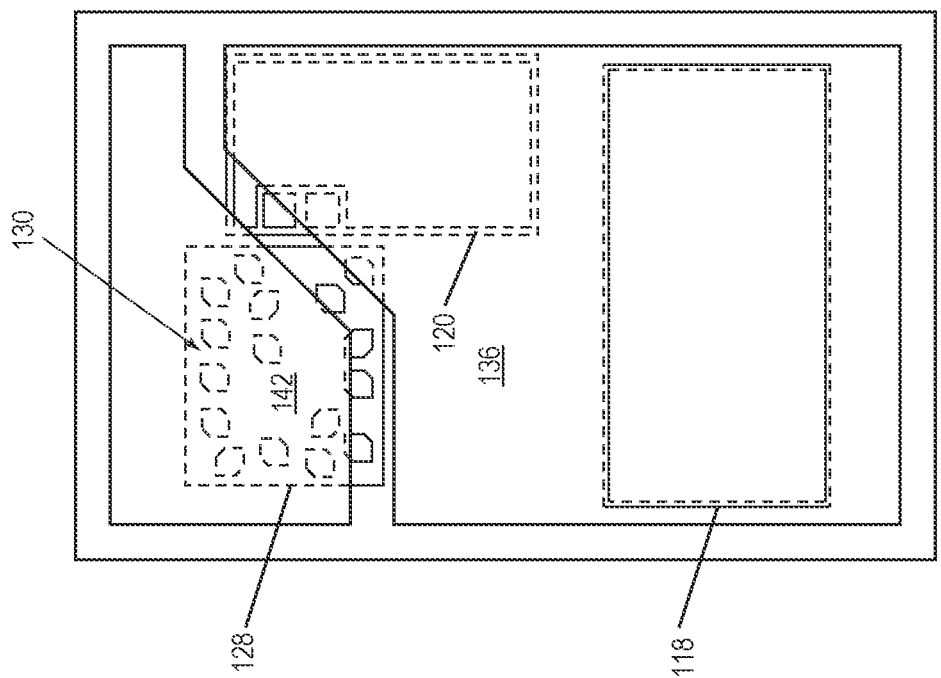
Figure 8:
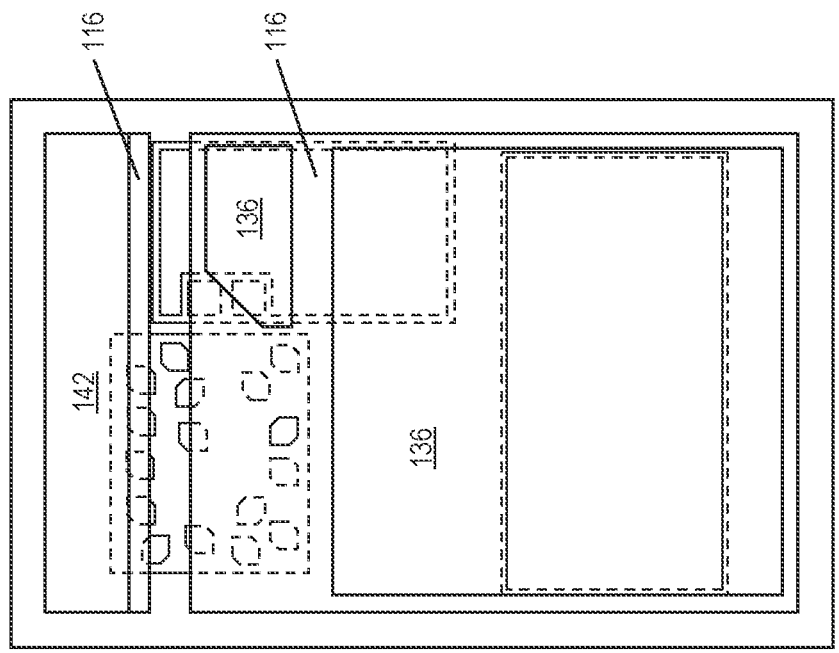
FIG. 8, which includes
Figure 8:
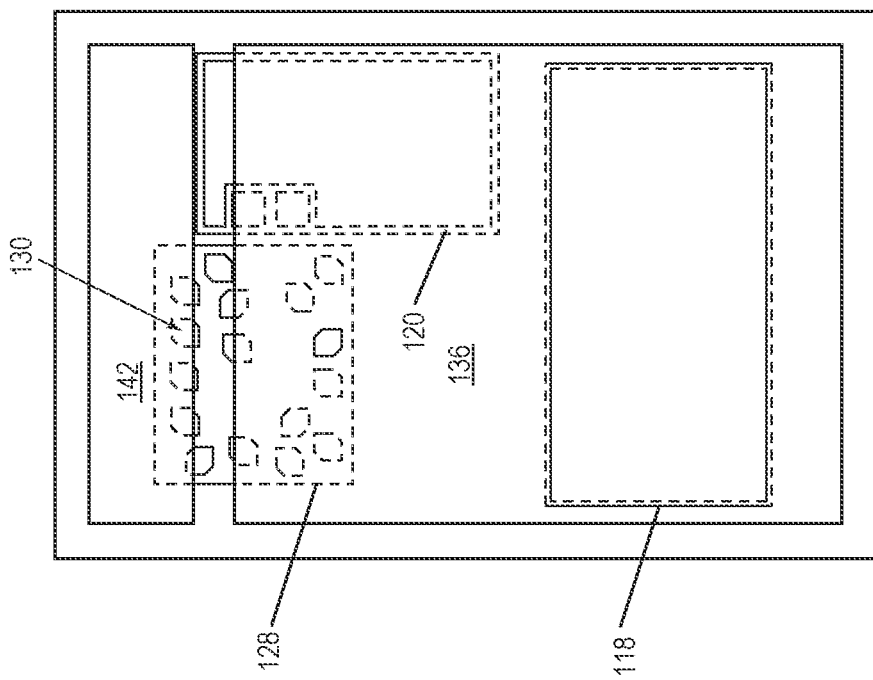

Referring to FIGS. 7-8, two different plan view-configurations of the shielding pad 142 and the switching signal pad 136 are shown, according to embodiments. In FIG. 7 the metal pad geometry of the first outer metallization layer 104 corresponds to that of FIG. 3, and in FIG. 8 the metal pad geometry of the first outer metallization layer 104 corresponds to that of FIG. 4. However, the electrically insulating layer 116 is formed with openings that expose portions of the shielding pad 142. In each case, a rectangular window exposes a portion of the shielding pad 142 that extends across the complete width of the first outer metallization layer 104.

Although the present disclosure is not so limited, the following numbered examples demonstrate one or more aspects of the disclosure.

Example 1. A semiconductor package, comprising: a laminate package substrate comprising a first outer metallization layer at least partially at a first outer side of the laminate package substrate, and a first interior metallization layer that is below the first outer metallization layer; first and second power transistor dies embedded within the laminate package substrate, the first and second power transistor dies each comprising a first load terminal and a second load terminal; a driver die embedded within the laminate package substrate and comprising a plurality of I/O terminals facing the first outer side of the semiconductor package; a plurality of I/O routings formed in the first interior metallization layer and electrically connected with the I/O terminals of the driver die; a switching signal pad formed in the first outer metallization layer and electrically connected with the second load terminal of the first power transistor die and the first load terminal of the second power transistor die; and a shielding pad formed in the first outer metallization layer that is configured to electrically shield at least one of the I/O routings from the switching signal pad during operation of the first and second power transistor dies.

Example 2. The semiconductor package of example 1, wherein the I/O routings comprise a first I/O routing that conveys a current magnitude signal, and wherein the shielding pad overlaps with the first I/O routing.

Example 3. The semiconductor package of claim 2, wherein the driver die is configured to adjust a gate signal that switches one of the first and second power transistor dies based upon the current magnitude signal from the first I/O routing.

Example 4. The semiconductor package of example 2, wherein the shielding pad completely overlaps with the first I/O routing.

Example 5. The semiconductor package of example 1, wherein the laminate package substrate further comprises an electrically insulating layer disposed at the first outer side, and wherein the shielding pad is completely covered by the electrically insulating layer.

Example 6. The semiconductor package of example 1, wherein the shielding pad is externally accessible at the first outer side.

Example 7. The semiconductor package of example 1, wherein the second load terminal of the first transistor die and the first load terminal of the second transistor die each face the first outer side of the semiconductor package, and wherein the switching signal pad overlaps with the second load terminal of the first transistor die and the first load terminal of the second transistor die.

Example 8. The semiconductor package of example 1, wherein the shielding pad is an electrically floating node of the semiconductor package.

Example 9. The semiconductor package of example 1, wherein the shielding pad is connected to an AGND node of the semiconductor package.

Example 10. The semiconductor package of example 1, wherein the switching signal pad and the shielding pad are from the only two nodes of the of the semiconductor package that are formed in the first outer metallization layer.

Example 11. The semiconductor package of example 1, wherein the first and second power transistor dies each comprise a gate terminal, wherein the gate terminal of the first power transistor die faces the first outer side of the semiconductor package, and wherein the gate terminal of the second power transistor die faces away from the first outer side of the semiconductor package.

Example 12. The semiconductor package of example 1, wherein the first outer metallization layer is a closest metallization layer of the laminate package substrate to the first interior metallization layer.

Example 13. The semiconductor package of example 1, wherein the first and second power transistor dies form the high-side switch and the low-side switch, respectively, of a half bridge circuit, and wherein the driver die is configured to control the half bridge circuit using the I/O routings.

Example 14. A method of forming a semiconductor package, the method comprising: forming a laminate package substrate comprising a first outer metallization layer and a first interior metallization layer that is below the first outer metallization layer, the first outer metallization layer being disposed at least partially at a first outer side of the laminate package substrate; embedding first and second power transistor dies within the laminate package substrate, the first and second power transistor dies each comprising a first load terminal and a second load terminal; embedding a driver die within the laminate package substrate, the driver die comprising a plurality of I/O terminals facing the first outer side of the semiconductor package; forming a plurality of I/O routings in the first interior metallization layer that are electrically connected with the I/O terminals of the driver die; forming a switching signal pad in the first outer metallization layer that is electrically connected with the second load terminal of the first power transistor die and the first load terminal of the second power transistor die; and forming a shielding pad in the first outer metallization layer that is configured to electrically shield at least one of the V/O routings from the switching signal pad during operation of the first and second power transistor dies.

Example 15. The method of example 14, wherein forming the laminate package comprises forming a core dielectric region, a first laminate layer over the core dielectric region, and a second laminate layer over the first laminate layer, wherein the first and second power transistor dies and the driver die are embedded within openings in the core dielectric region, wherein the first interior metallization layer is formed on an upper surface of the first laminate layer, and wherein the first outer metallization layer is formed on an upper surface of the second laminate layer.

Example 16. The method of example 15, wherein each of the first and second laminate layers comprise pre-preg material and/or resin material.

Example 17. The method of example 14, wherein the I/O routings comprise a first I/O routing that conveys a current magnitude signal, and wherein the shielding pad overlaps with the first I/O routing.

Example 18. The method of example 17, wherein the driver die is configured to adjust a gate signal that switches one of the first and second power transistor dies based upon the current magnitude signal from the first I/O routing.

Example 19. The method of example 14, wherein the shielding pad is formed to be an electrically floating node of the semiconductor package.

Example 20. The method of example 14, wherein the shielding pad is formed to be an AGND node of the semiconductor package.

The semiconductor dies disclosed herein may have different device configurations. These device configurations include lateral devices that are configured to control a current flowing parallel to a main surface of the die and vertical devices that are configured to control current flowing between a main surface and an opposite facing rear surface of the semiconductor die. Moreover, the die or dies of the semiconductor package 100 may be formed in many different material technologies. For example, the one or more semiconductor dies of the semiconductor package 100 may comprise semiconductor material from group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SIC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

As used herein, the term "overlaps" refers to an arrangement whereby one structure at least partially covers another. A partially overlapping arrangement refers to an arrangement whereby one structure is partially covered and partially uncovered by another. A completely overlapping arrangement refers to an arrangement whereby one structure completely covers another. An item is covered by another item when there as an intersection in a vertical direction of the laminate package substrate 102 that is perpendicular to the surfaces of the metallization layers.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor package, comprising:
   a laminate package substrate comprising a first outer metallization layer at least partially at a first outer side of the laminate package substrate, and a first interior metallization layer that is below the first outer metallization layer;
   first and second power transistor dies embedded within the laminate package substrate, the first and second power transistor dies each comprising a first load terminal and a second load terminal;
   a driver die embedded within the laminate package substrate and comprising a plurality of I/O terminals facing the first outer side of the semiconductor package;
   a plurality of I/O routings formed in the first interior metallization layer and electrically connected with the I/O terminals of the driver die;
   a switching signal pad formed in the first outer metallization layer and electrically connected with the second load terminal of the first power transistor die and the first load terminal of the second power transistor die; and
   a shielding pad formed in the first outer metallization layer that is configured to electrically shield at least one of the I/O routings from the switching signal pad during operation of the first and second power transistor dies.

2. The semiconductor package of claim 1, wherein the I/O routings comprise a first I/O routing that conveys a current magnitude signal, and wherein the shielding pad overlaps with the first I/O routing.

3. The semiconductor package of claim 2, wherein the driver die is configured to adjust a gate signal that switches one of the first and second power transistor dies based upon the current magnitude signal from the first I/O routing.

4. The semiconductor package of claim 2, wherein the shielding pad completely overlaps with the first I/O routing.

5. The semiconductor package of claim 1, wherein the laminate package substrate further comprises an electrically insulating layer disposed at the first outer side, and wherein the shielding pad is completely covered by the electrically insulating layer.

6. The semiconductor package of claim 1, wherein the shielding pad is externally accessible at the first outer side.

7. The semiconductor package of claim 1, wherein the second load terminal of the first power transistor die and the first load terminal of the second power transistor die each face the first outer side of the semiconductor package, and wherein the switching signal pad overlaps with the second load terminal of the first transistor die and the first load terminal of the second transistor die.

8. The semiconductor package of claim 1, wherein the shielding pad is an electrically floating node of the semiconductor package.

9. The semiconductor package of claim 1, wherein the shielding pad is connected to an AGND node of the semiconductor package.

10. The semiconductor package of claim 1, wherein the switching signal pad and the shielding pad are from the only two nodes of the of the semiconductor package that are formed in the first outer metallization layer.

11. The semiconductor package of claim 1, wherein the first and second power transistor dies each comprise a gate terminal, wherein the gate terminal of the first power transistor die faces the first outer side of the semiconductor package, and wherein the gate terminal of the second power transistor die faces away from the first outer side of the semiconductor package.

12. The semiconductor package of claim 1, wherein the first outer metallization layer is a closest metallization layer of the laminate package substrate to the first interior metallization layer.

13. The semiconductor package of claim 1, wherein the first and second power transistor dies form a high-side switch and a low-side switch, respectively, of a half bridge circuit, and wherein the driver die is configured to control the half bridge circuit using the I/O routings.

14. A method of forming a semiconductor package, the method comprising:
    forming a laminate package substrate comprising a first outer metallization layer and a first interior metallization layer that is below the first outer metallization layer, the first outer metallization layer being disposed at least partially at a first outer side of the laminate package substrate;
    embedding first and second power transistor dies within the laminate package substrate, the first and second power transistor dies each comprising a first load terminal and a second load terminal;
    embedding a driver die within the laminate package substrate, the driver die comprising a plurality of I/O terminals facing the first outer side of the semiconductor package;
    forming a plurality of I/O routings in the first interior metallization layer that are electrically connected with the I/O terminals of the driver die;
    forming a switching signal pad in the first outer metallization layer that is electrically connected with the second load terminal of the first power transistor die and the first load terminal of the second power transistor die; and
    forming a shielding pad in the first outer metallization layer that is configured to electrically shield at least one of the I/O routings from the switching signal pad during operation of the first and second power transistor dies.

15. The method of claim 14, wherein forming the laminate package substrate comprises forming a core dielectric region, a first laminate layer over the core dielectric region, and a second laminate layer over the first laminate layer, wherein the first and second power transistor dies and the driver die are embedded within openings in the core dielectric region, wherein the first interior metallization layer is formed on an upper surface of the first laminate layer, and wherein the first outer metallization layer is formed on an upper surface of the second laminate layer.

16. The method of claim 15, wherein each of the first and second laminate layers comprise pre-preg material and/or resin material.

17. The method of claim 14, wherein the I/O routings comprise a first I/O routing that conveys a current magnitude signal, and wherein the shielding pad overlaps with the first I/O routing.

18. The method of claim 17, wherein the driver die is configured to adjust a gate signal that switches one of the first and second power transistor dies based upon the current magnitude signal from the first I/O routing.

19. The method of claim 14, wherein the shielding pad is formed to be an electrically floating node of the semiconductor package.

20. The method of claim 14, wherein the shielding pad is formed to be an AGND node of the semiconductor package.

\* \* \* \* \*

UNITED STATES PATENT AND TRADEMARK OFFICE
CERTIFICATE OF CORRECTION

| | | |
|---|---|---|
| PATENT NO. | : 12,431,367 B2 | Page 1 of 1 |
| APPLICATION NO. | : 18/122895 | |
| DATED | : September 30, 2025 | |
| INVENTOR(S) | : R. Fehler et al. | |

It is certified that error appears in the above-identified patent and that said Letters Patent is hereby corrected as shown below:

In the Claims

Column 12, Line 9 Claim 10, please change "of the of the" to -- of the --.

Signed and Sealed this
Twenty-fifth Day of November, 2025

John A. Squires
*Director of the United States Patent and Trademark Office*